US012416857B2

(12) United States Patent
Yamazoe et al.

(10) Patent No.: US 12,416,857 B2
(45) Date of Patent: *Sep. 16, 2025

(54) SUB-RESOLUTION ASSIST FEATURES

(71) Applicant: Taiwan Semiconductor Manufacturing Co., Ltd., Hsinchu (TW)

(72) Inventors: Kenji Yamazoe, San Jose, CA (US); Junjiang Lei, Fremont, CA (US); Danping Peng, Fremont, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/447,425

(22) Filed: Aug. 10, 2023

(65) Prior Publication Data

US 2023/0384665 A1    Nov. 30, 2023

Related U.S. Application Data

(60) Division of application No. 17/240,265, filed on Apr. 26, 2021, now Pat. No. 11,829,066, which is a
(Continued)

(51) Int. Cl.
G03F 1/70 (2012.01)
G03F 1/42 (2012.01)
(Continued)

(52) U.S. Cl.
CPC ............. *G03F 1/70* (2013.01); *G03F 1/42* (2013.01); *G03F 1/44* (2013.01); *G03F 7/2004* (2013.01); *G06F 17/16* (2013.01)

(58) Field of Classification Search
USPC .......................................... 716/54
See application file for complete search history.

(56) References Cited

U.S. PATENT DOCUMENTS 7,703,069 B1    4/2010  Liu
2008/0226157 A1  9/2008  Stokowski
(Continued)

FOREIGN PATENT DOCUMENTS

CN    101681093 A    3/2010
CN    101846886 A    9/2010
(Continued)

OTHER PUBLICATIONS

Hopkins, H. H., "On the Diffraction Theory of Optical Images," Proc. R. Soc. Lond. A, 1953, 217, 26 pages.
(Continued)

*Primary Examiner* — Bryce M Aisaka
(74) *Attorney, Agent, or Firm* — HAYNES AND BOONE, LLP

(57) ABSTRACT

Methods of semiconductor device fabrication are provided. In an embodiment, a method of semiconductor device fabrication includes receiving a first mask design comprising a first mask function, determining a transmission cross coefficient (TCC) of an exposure tool, decomposing the TCC into a plurality orders of eigenvalues and a plurality orders of eigenfunctions, calculating a kernel based on the plurality orders of eigenvalues and the plurality orders of eigenfunctions; and determining a first sub-resolution assist feature (SRAF) seed map by convoluting the first mask function and the kernel.

20 Claims, 9 Drawing Sheets

Related U.S. Application Data continuation of application No. 16/674,439, filed on Nov. 5, 2019, now Pat. No. 10,990,002.

(60) Provisional application No. 62/877,437, filed on Jul. 23, 2019.

(51) Int. Cl.
*G03F 1/44* (2012.01)
*G03F 7/20* (2006.01)
*G06F 17/16* (2006.01)

(56) References Cited

U.S. PATENT DOCUMENTS

| | | | |
|---|---|---|---|
| 2014/0317580 A1* | 10/2014 | Ye | G03F 1/36 716/53 |
| 2016/0231654 A1 | 8/2016 | Hsu | |
| 2017/0269470 A1* | 9/2017 | Lee | G06F 30/392 |
| 2020/0041891 A1 | 2/2020 | Hsu | |
| 2023/0005738 A1 | 1/2023 | Yamazoe | |

FOREIGN PATENT DOCUMENTS

| | | |
|---|---|---|
| CN | 102183874 A | 9/2011 |
| CN | 102566254 A | 7/2012 |
| CN | 107479335 A | 12/2017 |
| CN | 110727171 A | 1/2020 |

OTHER PUBLICATIONS

Kodera, Katsuyoshi et al., "Novel fine-tuned model-based SRAF generation method using coherence map," Proc. SPIE 7640, Optical Microlithography XXIII, 764017, Mar. 10, 2010, 10 pages.

Socha, Robert John et al., "Contact hole reticle optimization by using interference mapping lithography (IML)," Proc. SPIE 5377, Optical Microlithography XVII, May 28, 2004, 20 pages.

Yamazoe, Kenji et al., "Fast computation of constructive and destructive interference areas in partially coherent imaging for resolution enhancement in optical microlithography," Applied Optics, vol. 48, No. 8, Mar. 10, 2009, 6 pages.

\* cited by examiner

SUB-RESOLUTION ASSIST FEATURES

PRIORITY DATA

This application is a divisional application of U.S. patent application Ser. No. 17/240,265, filed Apr. 26, 2021, which is a continuation application of U.S. patent application Ser. No. 16/674,439, filed Nov. 5, 2019, which claims the benefit of U.S. Provisional Application No. 62/877,437, filed Jul. 23, 2019, each of which is hereby incorporated by reference in its entirety.

BACKGROUND

The electronics industry has experienced an ever-increasing demand for smaller and faster electronic devices to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling down has also introduced increased complexity to the semiconductor manufacturing process. Thus, the realization of continued advances in semiconductor ICs and devices calls for similar advances in semiconductor manufacturing processes and technology.

As merely one example, scaling down of IC dimensions has been achieved by extending the usable resolution of a given lithography generation by the use of one or more resolution enhancement technologies (RETs), such as phase shift masks (PSMs), off-axis illumination (OAI), optical proximity correction (OPC), and insertion of sub-resolution assist features (SRAFs) into a design layout. Several SRAF insertion or placement techniques have been proposed. Some of them, being rule-based, have relatively short turn-around time but far-from-ideal accuracy. Some of them use numerous iterations of mask optimization to achieve outstanding accuracy but take a long time for each SRAF insertion exercise. Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
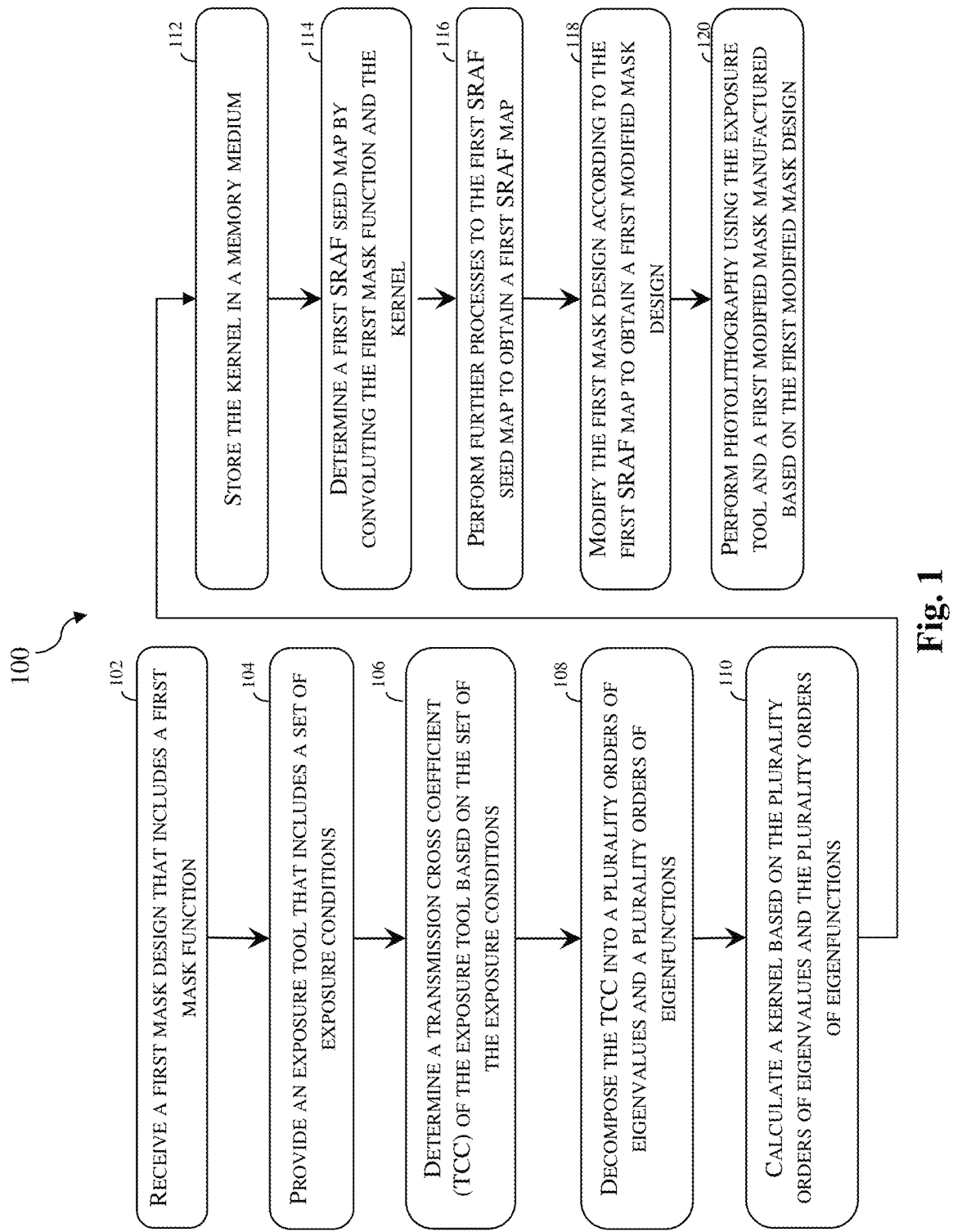
FIG. 1 is a flow chart of an embodiment of a method of semiconductor device fabrication, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods of semiconductor device fabrication. More specifically, the present disclosure is related to methods for generating an SRAF seed map for SRAF placement. SRAFs are mask features that are small enough not to be printed on a substrate (wafer) in a photolithography process but are so shaped and placed on a mask to improve the quality of photolithography image on the substrate. Methods to determine the shapes and positions of SRAFs are thereof of heightened interest. With respect to placement of SRAFs, several SRAF placement techniques have been proposed. For example, a conventional SRAF placement technique is a rule-based SRAF placement method. In this method, numerous test patterns and corresponding wafer images are obtained to populate empirical data and the empirical data is studied and analyzed to establish the rules. SRAFs are then placed on a mask based on such rules. Because SRAFs are placed based on a rule table, its turn-around-time is short. However, because the test patterns may not be representative of the actual patterns, rule-based SRAF placement techniques suffer from unsatisfactory accuracy.

Another conventional SRAF placement technique is inference mapping lithography (IML). Real-world exposure tools use partially coherent radiation source and their partial coherence may be decomposed in sum of coherent systems (SOCS) by performing decomposition on the transmission cross coefficient (TCC). In terms of optical physics, the TCC represents autocorrelation of the radiation source of the exposure tool with the projection pupil of the exposure tool. Therefore, the TCC is a mathematical representation of the imaging capability of the exposure tool which includes an ensemble of various exposure conditions of the exposure tool. The TCC may be decomposed into a set of eigenfunctions ($\phi$) and a set of eigenvalues ($\lambda$). IML only considers the first order eigenfunction of the TCC to determine SRAF placement. Because only the first order eigenfunction is included in IML, effect of exposure conditions of the exposure tool may not be sufficiently factored and accuracy may be less than satisfactory.

Still another conventional SRAF placement technique is called inverse lithography technology (ILT). ILT received its name due to its approach to lithography in an inverse fashion. Instead of calculating the aerial image based on a given mask design, it calculates a mask design necessary to generate a target aerial image. Although ILT may have superior accuracy, its turn-around-time may be unduly long and intractable. In some instances, ILT may require more than 300 times of the time needed to conclude a rule-based SRAF placement process. That is why ILT is currently mostly used to perform spot repairs of mask. Moreover, while mask three-dimensional (3D) effect has been observed and researched, integration of the mask 3D effect has been largely absent from conventional SRAF placement techniques.

The present disclosure put forth methods of semiconductor device fabrication where the placement of SRAFs includes better consideration of exposure conditions of the exposure tool and influence due to mask 3D effect. By including all order of the eigenvalues and eigenfunctions of TCC in the calculation of a kernel, methods according to embodiments of the present disclosure consider exposure conditions of the exposure tool, including illumination intensity of the exposure tool, a numerical aperture of the exposure tool, a depth of focus (DOF), a thickness of a resist stack to be patterned, or a range of an aberration. In addition, methods of the present disclosure may include diffraction components to address polarization due to mask three-dimensional (3D) effect. Because of the consideration of the exposure conditions and the mask 3D effect, methods of the present disclosure have better accuracy than conventional rule-based SRAF placement techniques and IML techniques. Moreover, when methods of the present disclosure are used, a kernel generated based on a set of exposure conditions of an exposure tool may be stored and reused whenever a new mask design is introduced. The reuse of the kernel may greatly reduce the turn-around-time to a level similar to that of the rule-based techniques, which is a fraction of the turn-around-time of ILT. In some instances, after a kernel of the exposure tool is generated and stored, the turn-around-time to generate an SRAF seed map using the methods of the present disclosure is about 10% or 50% more of that of the conventional rule-based techniques for SRAF seed map generation.

IC manufacturing includes multiple entities, such as a design house, a mask house, and an IC manufacturer (i.e., a fab). These entities interact with one another in the design, development, and manufacturing cycles and/or services related to manufacturing an integrated circuit (IC) device. These entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house, mask house, and IC manufacturer may have a common owner, and may even coexist in a common facility and use common resources. In various embodiments, the design house, which may include one or more design teams, generates an IC design layout. The IC design layout may include various geometrical patterns designed for the fabrication of the IC device. By way of example, the geometrical patterns may correspond to patterns of metal, oxide, or semiconductor layers that make up the various components of the IC device to be fabricated. The various layers collectively form various features of the IC device. For example, various portions of the IC design layout may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. In various examples, the design house implements a design procedure to form the IC design layout. The design procedure may include logic design, physical design, and/or place and route. The IC design layout may be presented in one or more data files having information related to the geometrical patterns which are to be used for fabrication of the IC device. In some examples, the IC design layout may be expressed in a GDSII file format or DFII file format.

In some instances, the design house may transmit the IC design layout to the mask house, for example, via the network connection described above. The mask house may then use the IC design layout to generate a mask design, such as the first mask design 202, modify the mask design to form a modified mask design, and manufacture one or more masks to be used for fabrication of the various layers of the IC device according to the modified mask design. In various examples, the mask house performs mask data preparation, where the IC design layout is translated into a form that can be physically written by a mask writer, and mask fabrication, where the design layout prepared by the mask data preparation is modified to generate a modified mask design and is then fabricated. In some embodiments of the present disclosure, some of the operations described above are not performed by the mask house, but the IC manufacturer, especially when information of the exposure tool is used.

FIG. 1 is a flow chart of an embodiment of a method 100 of semiconductor device fabrication. Method 100 will be described below in conjunction with FIG. 2, which is a schematic illustration of process steps of method 100. Additional steps can be provided before, during, and after method 100, and some of the steps described can be moved, replaced, or eliminated for additional embodiments of method 100.

Figure 2:
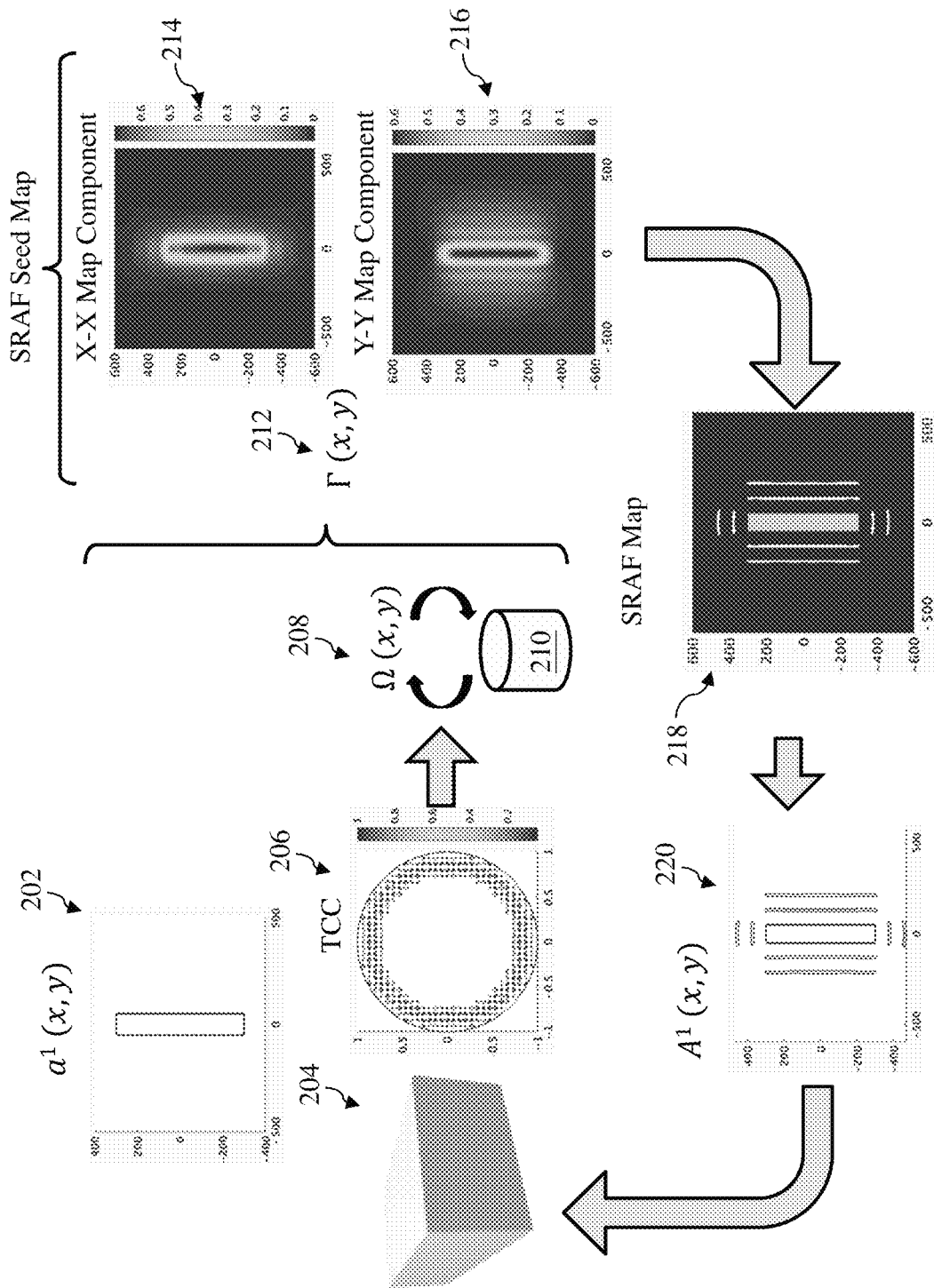
FIG. 2 is a schematic illustration of process steps of the method in FIG. 1, according to various aspects of the present disclosure.
Figure 3:
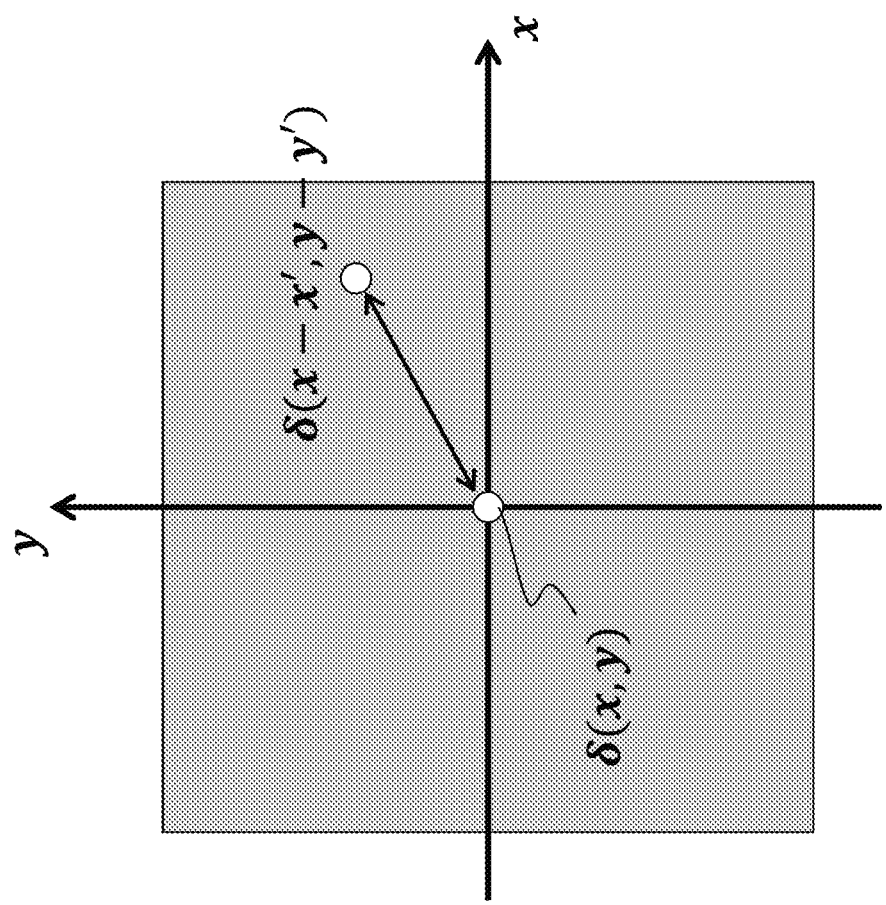
FIG. 3 is a schematic illustration of two points on a mask, according to various aspects of the present disclosure.

Referring now to FIGS. 1 and 2, the method 100 includes a block 102 where a first mask design 202 is received. In some instances, the method 100 is performed by the IC manufacturer and the first mask design 202 is received from the mask house. In some other instances, the first mask design is provided by the mask house and the method 100 is also performed by the mask house. The first mask design 202 includes mask features that can be characterized by or expressed in a first mask function ($a^1(x,y)$). Reference is now made to FIG. 3, which illustrates the type of information described in a mask function, such as the first mask function. A mask function contains relative positions and interactions between a point (x,y) and a point (x-x', y-y'), which is shifted from the point (x,y) by amount −x' and −y'. Accordingly, the first mask function ($a^1(x,y)$) may also be expressed as two δ functions:

$$a^1(x,y)=\delta(x,y)+\delta(x-x',y-y')$$

In some embodiments, the radiation of the exposure tool 204 may be polarized and the polarization may be changed by the mask. For example, the radiation of the exposure tool 204 incident on the mask may be polarized in the X direction and the light diffracted by the mask may be polarized in the Y direction at the pupil. With respect to such a near field incoming and outgoing radiation pair, the first mask function includes an X-Y component ($a^{1,xy}(x,y)$) and the X-Y component represents a simulated interaction between the X-polarized radiation on the mask and the Y-polarization radiation on the pupil. Similarly, with respect to the X-polarized incident radiation and X-polarized outgoing radiation, the first mask function includes an X-X component ($a^{1,xx}(x,y)$); with respect to the Y-polarized incident radiation and X-polarized outgoing radiation, the first mask function includes a Y-X component ($a^{1,yx}(x,y)$); and with respect to the Y-polarized incident radiation and Y-polarized outgoing radiation, the first mask function includes a Y-Y component ($a^{1,yy}(x,y)$). In cases where the first mask design 202 is assumed to be implemented as an ideal mask (shown as 702 in FIG. 7, described below), the X-X, X-Y, Y-X, and YY components are identical to one another. In cases where the first mask design 202 is assumed to be implemented as a real-world mask (shown as 802 in FIG. 8, described below) with mask three-dimensional (3D) effect, the X-X, X-Y, Y-X, and YY components are not identical and should be considered separately.

Referring now to FIG. 1, the method 100 includes a block 104 where an exposure tool 204 is provided. The exposure tool 204 includes a radiation source or a light source. The exposure tool 204 may be a deep ultraviolet (DUV) exposure tool with a DUV radiation sources (such as KrF excimer laser or ArF excimer laser) or an extreme ultraviolet (EUV) exposure tool with an EUV radiation sources (such as a tin droplet laser plasma EUV generation). In some embodiments, the exposure tool 204 may be a DUV exposure tool with immersion lithography capabilities. In addition to a radiation source, the exposure tool 204 may include various optical components such as lens and mirrors and may be configured to expose a thickness of a resist stack on a substrate on a substrate stage. The radiation source, optical components, and configurations of the exposure tool 204 may be characterized by a set exposure conditions, including, for example, illumination intensity of the radiation source of the exposure tool, shape of the radiation source, a numerical aperture (NA) of the exposure tool, a depth of focus (DOF), a thickness of a resist stack to be patterned, a range of an aberration, and an amount of defocus. Unless the configuration of the exposure tool 204 is intentionally or inadvertently changed, the set of exposure conditions is unique to the exposure tool 204. As will be described in more details below, the unique set of exposure conditions makes it possible to only calculate kernel once and store the kernel for reuse with different mask designs.

Figure 4:
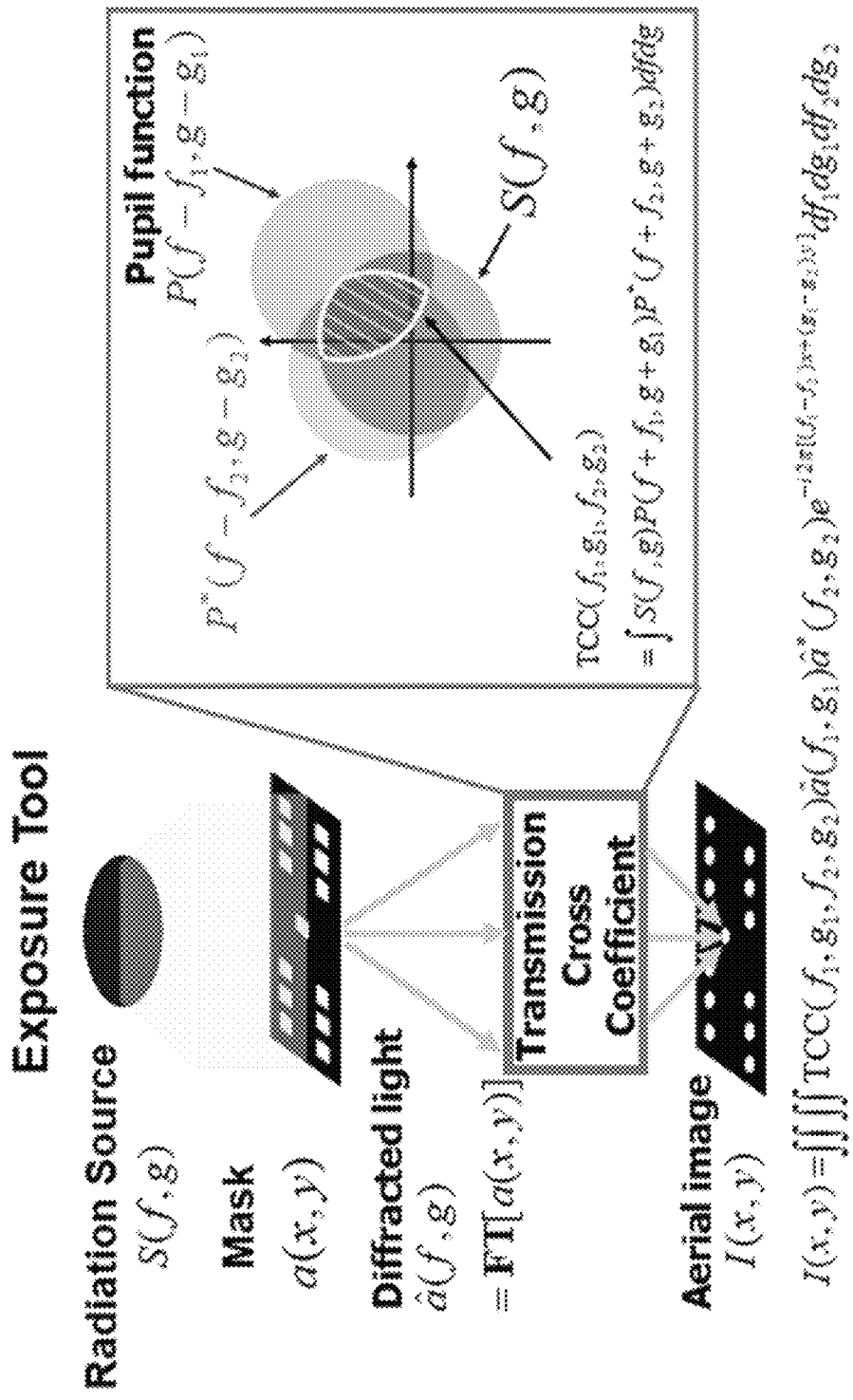
FIG. 4 is a schematic illustration of components of an exposure tool, according to various aspects of the present disclosure.

Referring to FIGS. 1 and 2, the method 100 includes a block 106 where a transmission cross coefficient (TCC) 206 of the exposure tool 204 is determined based on the set of the exposure conditions. FIG. 4 illustrates major component planes in an exposure tool (or lithography system). The exposure tool includes a radiation source (light source), a mask (reticle), a pupil plane, and an aerial image. The radiation source (or light source) may be expressed as a function S ($S(f, g)$), where f and g are coordinates on a plane at the radiation source. As described above, the reticle (or the mask) may be expressed as a function a ($a(x, y)$), where x and y are coordinates on a plane at the mask. Radiation diffracted by features on the mask may be expressed a Fourier Transform of the mask function:

$$\hat{a}(f,g)=FT[a(x,y)]$$

At the pupil plane, a pupil function is represented as a function of P ($P(f, g)$). A complex conjugate of the pupil function is given by a function of P* ($P^*(f, g)$). The TCC is obtained by:

$$TCC(f_1,g_1,f_2,g_2)=\int S(f,g)P(f+f_1,g+g_1)P^*(f+f_2,g+g_2)df dg$$

The aerial image may be expressed as a function of I, expressed as:

$$I(x,y)=\int\int\int\int TCC(f_1,g_1,f_2,g_2)\hat{a}(f_1,g_1)\hat{a}^*(f_2,g_2)e^{-i2\pi[(f_1+f_2)x+(g_1-g_2)y]}df_1 dg_1 df_2 dg_2$$

Referring now to FIG. 1, the method 100 includes a block 108 where a transmission cross coefficient (TCC) 206 is decomposed into a plurality orders of eigenvalues and a plurality orders of eigenfunctions. In some implementations, through SOCS, the TCC 206 may be decomposed into a plurality orders of eigenvalues (each or which may be represented as $\lambda_i$, where i denotes i-th eigenvalue of the TCC 206) and a plurality orders of eigenfunctions (each of which may be represented as $\phi_i$, where i denotes i-th eigenfunction of the TCC 206). In some embodiments, there are N eigenfunctions and N eigenvalues, where N is an integer and may be between 1 and the number of point sources in the light source. The TCC 206 may be rewritten as:

$$T(f_1,g_1,f_2,g_2)=\Sigma_{i=1}^{N}\lambda_i\Phi_i(f_1,g_1)\Phi_i^*(f_1,g_1), \text{ where }$$
$$\phi_i=FT[\Phi_i(f,g)]$$

Referring to FIGS. 1 and 2, the method 100 includes a block 110 where a kernel 208 is calculated based on the plurality orders of eigenvalues ($\lambda_i$) and the plurality orders of eigenfunctions ($\phi_i$). The kernel 208 includes interaction terms, each accounting for interaction between an origin point (0,0) and a point (x',y') on a plane of the mask. The kernel 208, which includes only the real part (Re), may be written as:

$$\Omega(x',y')=Re[\sum_{i=1}^{N}\lambda_i[\phi_i(x,y)\otimes\delta(x,y)]^*[\phi_i(x,y)\otimes\delta(x-x',y-y')]]$$

or $$\Omega(x',y')=Re[\sum_{i=1}^{N}\lambda_i\phi_i^*(0,0)\phi_i(-x',-y')]$$

If the coordinate representation (x',y') is changed to the coordinate representation (x, y), the kernel 208 may be expressed as:

$$\Omega(x, y) = \text{Re}[\sum_{i=1}^{N} \lambda_i \phi_i^*(0,0)\phi_i(-x, -y)]$$

Referring to FIG. 1, the method 100 includes a block 112 where the kernel 208 is stored in a memory medium 210. In some embodiments, the memory medium 210 may be one or more hard drives, mass storage devices, or flash drives coupled to a computer system physically by connectors or connector cables or wirelessly by wireless communication protocols. The kernel 208 may be stored in any computer-readable format that may be accessed by the computer system to perform operations of methods according to the present disclosure. In some implementations, the computer system may also be communicatively connected to the exposure tool 204 physically by connectors or connector cables or wirelessly by wireless communication protocols. The computer system may be a single computer, local area networks, client-server networks, wide area networks, internets, a hand-held device, a wireless device, a portable device, a terminal, a server, a cloud computing device, a super computer, or a distributed system. Such a computer system may take the form of an entirely hardware embodiment, an entirely software embodiment, or an embodiment containing both hardware and software elements. By way of example, hardware generally includes at least processor-capable platforms, such as client-machines (also known as personal computers or servers), and hand-held processing devices (such as smart phones, personal digital assistants (PDAs), or personal computing devices (PCDs), for example. In addition, hardware may include any physical device that is capable of storing machine-readable instructions, such as a hard drive, a flash drive or other data storage devices. Other forms of hardware include hardware subsystems, including transfer devices such as modems, modem cards, ports, and port cards, for example. In various examples, software generally includes any machine code stored in any memory medium, such as RAM or ROM, and machine code stored on other devices (such as floppy disks, flash memory, or a CD-ROM, for example). In some embodiments, software may include source or object code, for example. In addition, software may encompass any set of instructions capable of being executed in a client machine or server. In embodiments of the present disclosure, after the kernel 208 is stored in the memory medium 210, the kernel 208 may be accessible, retrievable, downloadable at the computer system or other computing device communicatively coupled to the computer system, operated by an authorized user.

Referring to FIG. 1, the method 100 includes a block 114 where a first SRAF seed map 212 is determined by convoluting the first mask function ($a^1(x,y)$) and the kernel 208. The first SRAF seed map 212 may be expressed as:

$$\Gamma^1(x,y) = a^1(x,y) \otimes \Omega(x,y)$$

As described above, the first mask function includes an X-Y component ($a^{1xy}(x,y)$), an X-X component ($a^{1xx}(x,y)$), a Y-X component ($a^{1yx}(x,y)$), and a Y-Y component ($a^{1yy}(x,y)$). The i-th eigenfunction of the TCC that interacts with ($a^{1xx}(x,y)$) is defined as $\phi_i^{xx}(x,y)$, the i-th eigenfunction of the TCC that interacts with ($a^{1xy}(x,y)$) is defined as $\phi_i^{xy}(x,y)$, the i-th eigenfunction of the TCC that interacts with ($a^{1yx}(x,y)$) is defined as $\phi_i^{yx}(x,y)$, and the i-th eigenfunction of the TCC that interacts with ($a^{1yy}(x,y)$) is defined as $\phi_i^{yy}(x,y)$. Corresponding X-X kernel component ($\Omega^{xx}(x,y)$), X-Y kernel component ($\Omega^{xy}(x,y)$), Y-X kernel component ($\Omega^{yx}(x,y)$), and Y-Y kernel component ($\Omega^{yy}(x,y)$) may be obtained and expressed as:

$$\Omega^{xx}(x, y) = \text{Re}[\sum_{i=1}^{N} \lambda_i \phi_i^{xx*}(0,0)\phi_i^{xx}(-x, -y)]$$

$$\Omega^{xy}(x, y) = \text{Re}[\sum_{i=1}^{N} \lambda_i \phi_i^{xy*}(0,0)\phi_i^{xy}(-x, -y)]$$

$$\Omega^{yx}(x, y) = \text{Re}[\sum_{i=1}^{N} \lambda_i \phi_i^{yx*}(0,0)\phi_i^{yx}(-x, -y)]$$

$$\Omega^{yy}(x, y) = \text{Re}[\sum_{i=1}^{N} \lambda_i \phi_i^{yy*}(0,0)\phi_i^{yy}(-x, -y)]$$

It is noted that each of the X-X kernel component, the X-Y kernel component, the Y-X kernel component, and the Y-Y kernel component is independent from the first mask function of the first mask design. In addition, each of the X-X kernel component, the X-Y kernel component, the Y-X kernel component, and the Y-Y kernel component is unique to the set of exposure conditions of the exposure tool 204. It allows the kernel 208 to be stored in the memory medium 210 and reused with mask designs different from the first mask design 202. The X-X component, X-Y component, Y-X component, and Y-Y component of the first mask function and the X-X kernel component, X-Y kernel component, Y-X kernel component, and Y-Y kernel component may be convoluted, respectively, to obtain the first SRAF seed map 212, which may also be expressed as:

$$\Gamma^1(x,y) = a^{1xx}(x,y) \otimes \Omega^{xx}(x,y) + a^{1xy}(x,y) \otimes \Omega^{xy}(x,y) + a^{1yx}(x,y) \otimes \Omega^{yx}(x,y) + a^{1yy}(xy) \otimes \Omega^{yy}(x,y)$$

As described above, when the first mask design 202 is or is assumed to be an ideal mask (shown in FIG. 7, described below), the X-X, X-Y, Y-X, and YY components of the mask function are identical to one another and may be expressed as $a^1(x,y)$. It follows that the X-X kernel component, X-Y kernel component, Y-X kernel component, and Y-Y kernel component that correspond to X-X, X-Y, Y-X, and YY components of the mask function are also identical to one another and may be expressed as $\Omega(x,y)$. As a result, the first SRAF seed map 212 may be simplified as:

$$\Gamma^1(x,y) \approx a^1(x,y) \otimes \Omega(x,y)$$

The first SRAF seed map 212 may include an X-X map component 214 and a Y-Y map component 216, as shown in FIG. 2.

Referring to FIG. 1, the method 100 includes a block 116 where further processes are performed to the first SRAF seed map 212 to obtain a first SRAF map 218. According to the present disclosure, an SRAF seed map, such as the first SRAF seed map 212, includes information useful for SRAF placement determination. For example, an SRAF seed map includes local-minimum interference distribution (including intensity and coordinates), local-maximum interference distribution (including intensity and coordinates), and noise (including intensity and coordinates). The local-maximum interference distribution may be referred to as peak interference distribution and the local-minimum interference distribution may be referred to as valley interference distribution. In some instances, both the peak interference distribution and the valley interference distribution include components extending parallel to adjacent mask features and noise may include components extending perpendicular to adjacent mask features. Further processes are therefore needed to eliminate or reduce a level of the noise and enhance the signal strength of the peak interference distribution and the valley interference distribution. In some embodiments, high-pass filtering, bandpass filtering, or low-pass filtering may be used to remove noise and enhance the resolution of the peak interference distribution and the valley interference distribution. If the noise level is not reduced, SRAFs that extend perpendicular from mask features may be resulted. Such SRAFs do not improve accuracy and may also introduce defects in the aerial image. An SRAF map, such as the first SRAF map 218, includes not only placement positions of the SRAFs but also polygonal shapes of the SRAFs. Therefore, further processes are also needed to determine the polygonal shapes and dimensions of the SRAFs. For example, after an SRAF seed map is filtered to remove noise and enhance resolution, polygonal shapes of suitable dimensions may be place on or around the peaks in the filtered SRAF seed map. The process or processes to determine the polygonal shapes and dimensions of the SRAFs may also be referred to as process(es) to grow SRAFs. Based on the foregoing, such further processes at block 116 include operations to reduce noise and operations to superposition polygonal shapes based on the peak interference distribution the valley interference distribution.

Referring now to FIG. 1, the method 100 includes a block 118 where the first mask design 202 is modified according to the first SRAF map 218 to obtain a first modified mask design 220. In some embodiments, the SRAFs in the first SRAF map 218 may be placed on the first mask design 202 by superpositioning the first SRAF map 218 onto the first mask design 202 to obtain a first modified mask design 220.

Referring now to FIGS. 1 and 2, the method 100 includes a block 120 where photolithography is performed using the exposure tool 204 and a first modified mask manufactured based on the first modified mask design 220. In some embodiments, the mask house may manufacture the first modified mask based on the first modified mask design 220 and ship the first modified mask to the IC manufacturer. The IC manufacturer may then perform photolithography using the exposure tool 204 and the first modified mask.

Figure 5:
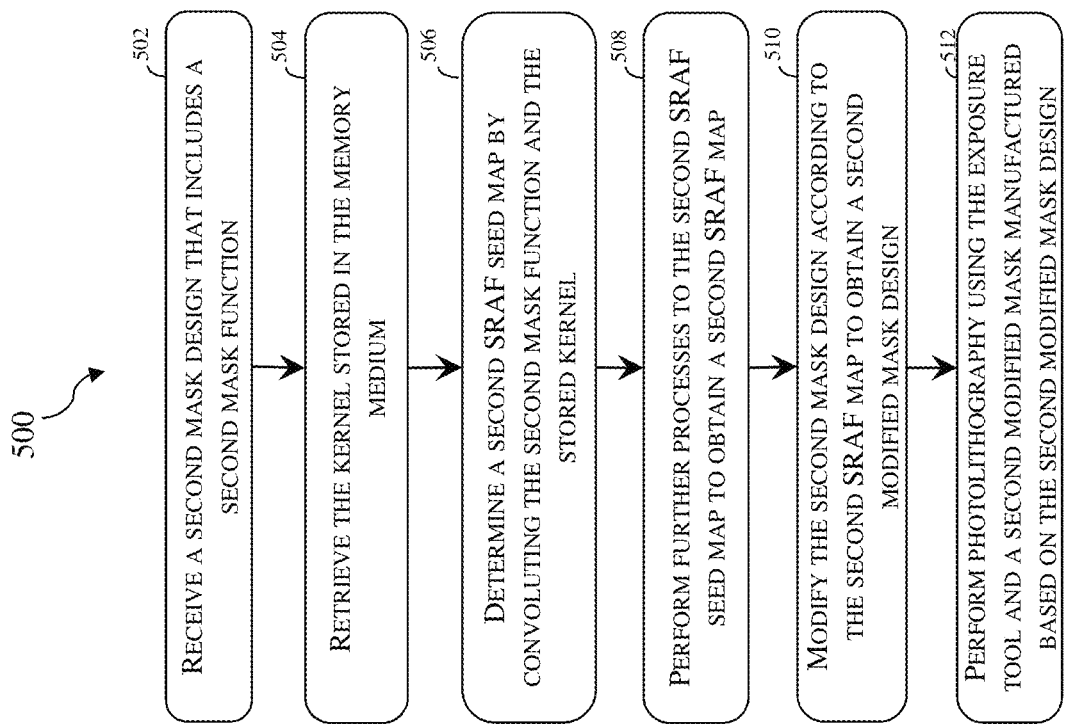
FIG. 5 is a flow chart of an embodiment of a method of semiconductor device fabrication, according to various aspects of the present disclosure.

As described before, once a characteristic kernel of an exposure tool is generated and stored in a memory medium, and the stored kernel may be accessed and reused with mask designs different from the first mask design 202 to create a different SRAF seed map. Reference is now made to FIG. 5, which illustrates a flow chart of a method 500 for semiconductor fabrication where the stored kernel is accessed and reused. Method 500 will be described below in conjunction with FIG. 6, which is a schematic illustration of process steps of method 500. Additional steps can be provided before, during, and after method 500, and some of the steps described can be moved, replaced, or eliminated for additional embodiments of method 500.

Figure 6:
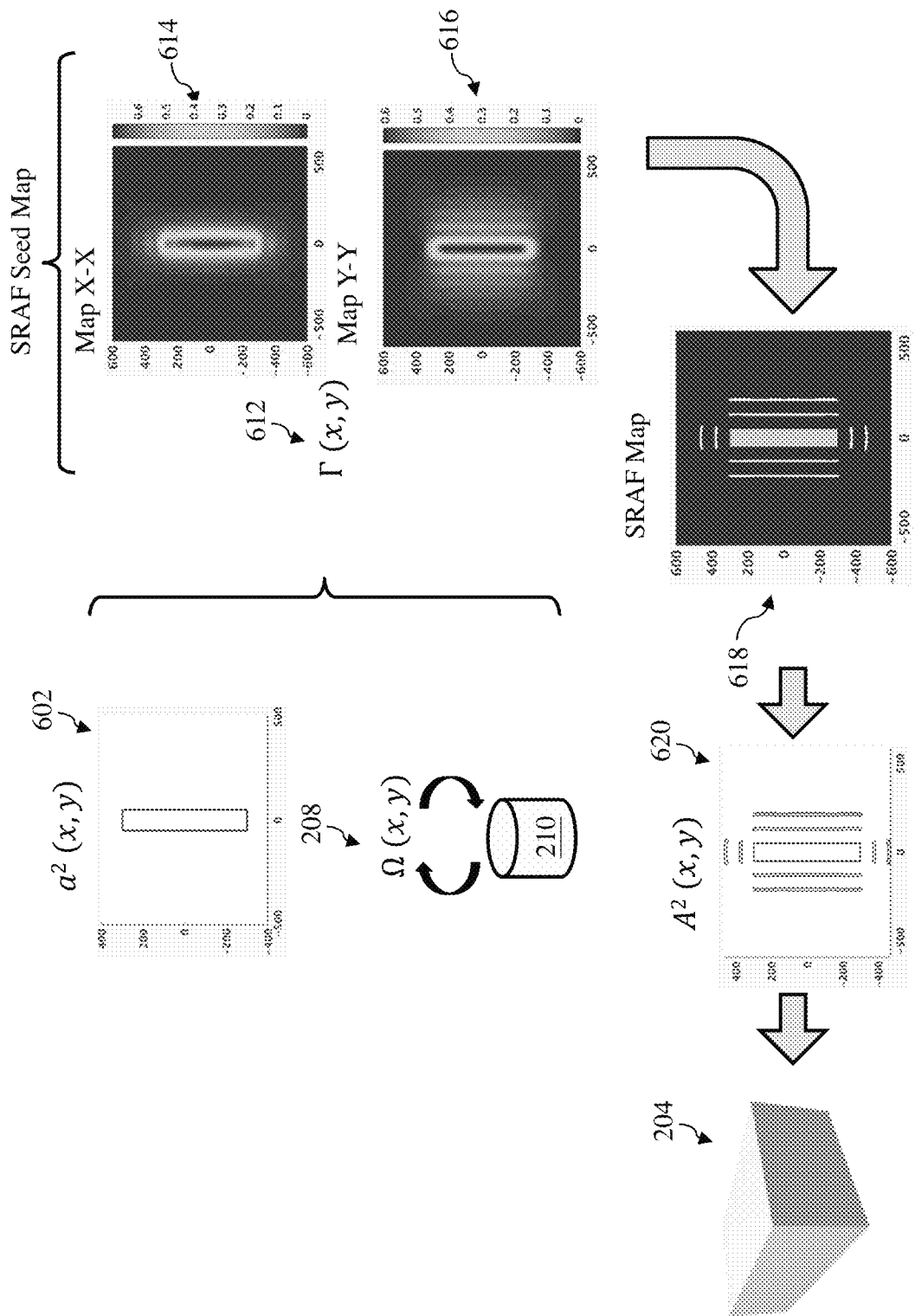
FIG. 6 is a schematic illustration of process steps of the method in FIG. 5, according to various aspects of the present disclosure.

Referring to FIGS. 5 and 6, the method 500 includes a block 502 where a second mask design 602 that includes a second mask function ($a^2(x,y)$) is received. The method 500 commences after the method 100 is concluded. Therefore, at the time the method 500 begins, the kernel 208 has already been generated and stored in the memory medium 210. The second mask design 602 is different from the first mask design 202 and the first mask function ($a^1(x,y)$) is different from the second mask design ($a^2(x,y)$). In some instances, the method 500 is performed by the IC manufacturer and the second mask design 602 is received from the mask house. In some other instances, the second mask design 602 is provided by the mask house and the method 500 is also performed by the mask house.

Referring to FIGS. 5 and 6, the method 500 includes a block 504 where the kernel 208 stored in the memory medium 210 is retrieved. As described above, the kernel 208 is unique to the set of exposure conditions of the exposure tool 204 and after the kernel 208 is determined using method 100, the kernel 208 is stored in the memory medium 210. In some embodiments represented in FIG. 6, the set of exposure conditions of the exposure tool 204 remains the same for a photolithography process using the second mask design 602. In these embodiments, the kernel 208 may be retrieved at block 504 by an authorized user and reused. As the kernel 208 is reused, there is no need to calculate the TCC 206 and the kernel 208 again. Because the calculation of the kernel 208 may take a substantial amount of time, the capability to reuse the kernel may greatly reduce the turn-around-time and conserve system resources.

Referring to FIGS. 5 and 6, the method 500 includes a block 506 where a second SRAF seed map 612 is determined by convoluting the second mask function ($a^2(x,y)$) and the stored kernel 208. Except for the use of the second mask function ($a^2(x,y)$), operations at block 506 are substantially similar to operations at block 114. Description of the detailed calculation is omitted for brevity.

Referring to FIGS. 5 and 6, the method 500 includes a block 508 where further processes are performed to the second SRAF seed map 612 to obtain a second SRAF map 618. Except for the use of the second SRAF seed map 612, operations at block 508 are substantially similar to operations at block 116. Description of the detailed calculation is omitted for brevity.

The second SRAF seed map 612 may include an X-X map component 614 and a Y-Y map component 616, as shown in FIG. 6.

Referring to FIGS. 5 and 6, the method 500 includes a block 510 where the second mask design ($a^2(x,y)$) is modified according to the second SRAF map 618 to obtain a second modified mask design 620. Except for the use of the second SRAF map 618, operations at block 510 are substantially similar to operations at block 118. Description of the detailed calculation is omitted for brevity.

Referring now to FIGS. 5 and 6, the method 500 includes a block 512 where photolithography is performed using the exposure tool 204 and a second modified mask manufactured based on the second modified mask design 620. Except for the use of the second modified mask design 620, operations at block 510 are substantially similar to operations at block 118. Description of the detailed calculation is omitted for brevity.

Figures 7, 8:
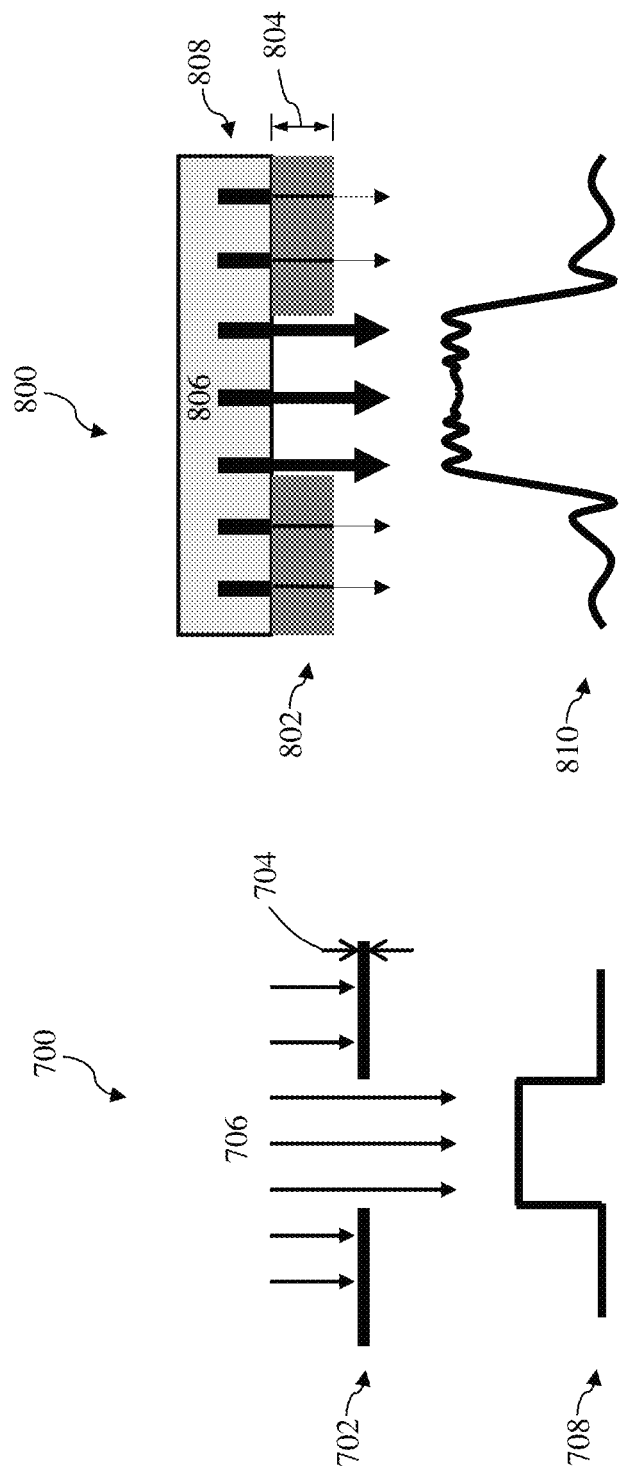
FIG. 7 is a schematic illustration of diffraction of illumination at an ideal mask, according to various aspects of the present disclosure.
FIG. 8 is a schematic illustration of diffraction of illumination at a real-world mask with a thickness, according to various aspects of the present disclosure.

Non-ideal characteristic of real-world masks may also be considered according to some embodiments of the present disclosure. An ideal exposure configuration 700 is illustrated in FIG. 7. The ideal exposure configuration 700 includes an ideal mask 702, which includes an infinitely small thickness 704 and is capable of completely blocking the incident radiation 706. Due to complete blockage of the incident radiation 706 and the infinitely small thickness 704, a radiation amplitude 708 after the ideal mask 702 includes a step function shown in FIG. 7. Where the ideal mask 702 blocks the radiation 706, the radiation amplitude 708 drops to zero (0%). Where the ideal mask 702 allows the radiation 706 through the mask opening, the radiation amplitude 708 increases to the full amplitude (100%) of the radiation 706. However, in reality, a mask has at least a finite thickness and does not have complete blockage of radiation. A real-world exposure configuration 800 is illustrated in FIG. 8. The real-world exposure configuration 800 includes a real-world mask 802, which includes a finite thickness 804 and does not completely block the radiation 806. In some instances, the real-world mask 802 may be disposed on a glass substrate 808. The finite thickness 804 and non-ideal radiation blockage capability of the real-world mask 802 may result in a non-ideal radiation amplitude 810. These non-ideal characteristics may be summarily referred to as mask three-dimensional (3D) effect. While only transmissive masks are shown in FIGS. 7 and 8 as example, similar ideal and non-ideal behaviors may be observed on reflective masks as well. An ideal reflective mask includes perfectly reflective patterns defined on a perfectly absorptive surface. In addition, radiation is reflected only on a very top surface and does not penetrate into the mask. A real-world reflective mask includes partially reflective patterns defined on a partially absorptive surface. In terms of penetration, radiation may penetrate a depth of one or more layers on a real-world reflective mask and may be reflected by a layer other than the topmost layer.

As radiation is an electromagnetic wave, the mask 3D effect may be calculated using the Maxwell Equations, which include the Gauss's law $$(\nabla \cdot E = \frac{\rho}{\varepsilon_0}),$$

Gauss's law for magnetism ($\nabla \cdot B = 0$), Maxwell-Faraday equation $$(\nabla \times E = -\frac{\delta B}{\delta t}),$$

and Ampere's circuital law $$(\nabla \times B = \mu_0 (J + \varepsilon_0 \frac{\delta E}{\delta t})).$$

In some embodiments, the mask 3D effect may be approximated using a simplified solution to the Maxwell Equations. For example, although SRAFs placed on a mask may contribute to the mask 3D effect too, their contribution to the mask 3D effect is smaller than that of the main mask pattern. A simplified solution to the Maxwell Equations may drop off the mask 3D effect contributed by the SRAFs. This simplification may greatly reduce the complexity of calculation of the mask 3D effect. A solution or a simplified solution to the Maxwell Equation may be used to modify the mask function such that mask 3D effect is considered. The mask 3D effect may be expressed as one or more functions M. In some implementations, the mask 3D effect may be decomposed into an X-X diffraction component ($M_{xx}$), an X-Y diffraction component ($M_{xy}$), a Y-X diffraction component ($M_{yx}$), and a Y-Y diffraction component ($M_{yy}$).

Figure 9:
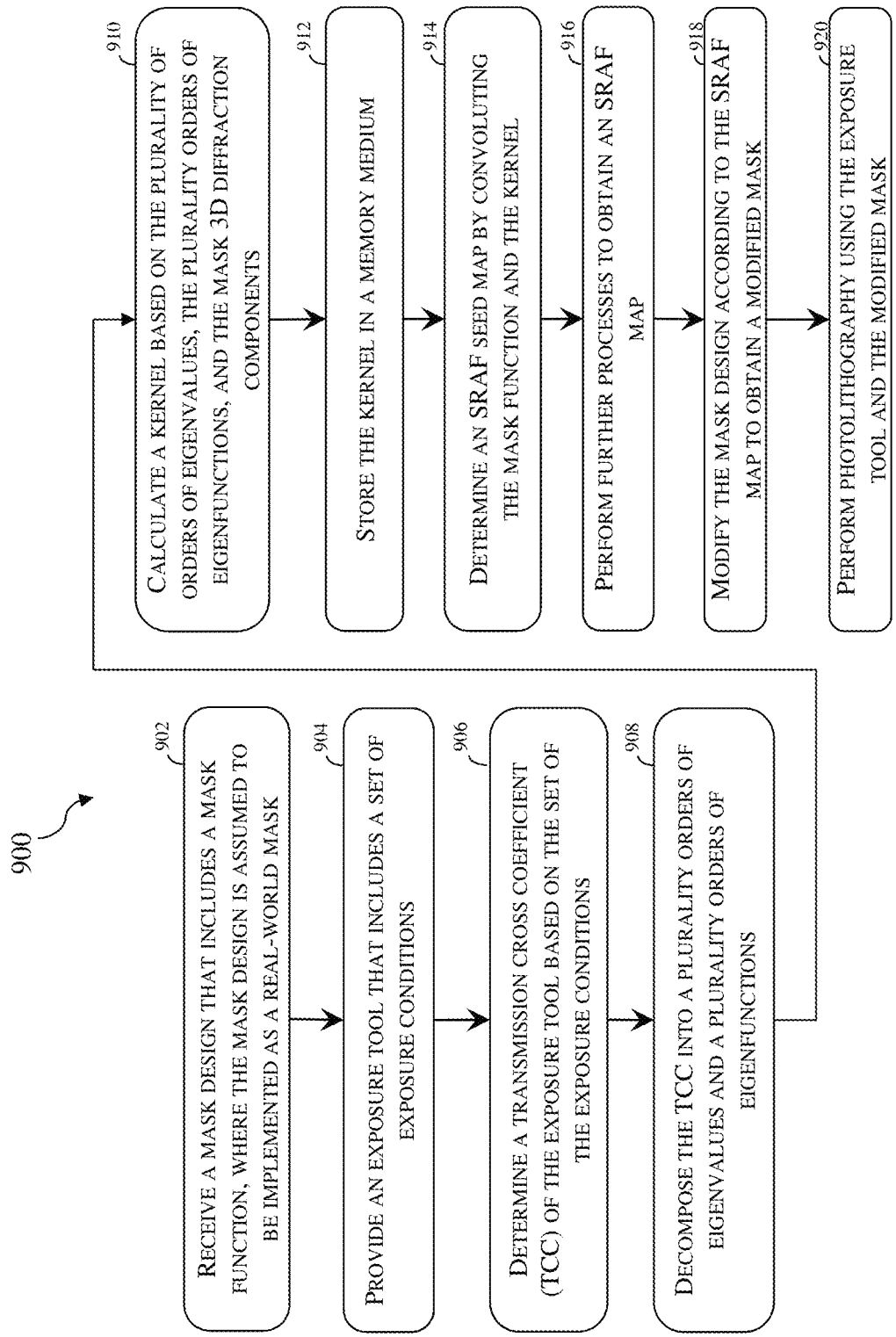
FIG. 9 is a flow chart of an embodiment of a method of semiconductor device fabrication where mask three-dimensional (3D) effect is considered, according to various aspects of the present disclosure.

An example method that considers the mask 3D effect is illustrated as method 900. A flow chart of method 900 is illustrated in FIG. 9. Method 900 will be described below in conjunction with FIG. 10, which is a schematic illustration of process steps to generate a modified mask design and manufacture ICs using a modified mask manufactured based on the modified mask design. Additional steps can be provided before, during, and after method 900, and some of the steps described can be moved, replaced, or eliminated for additional embodiments of method 900.

Figure 10:
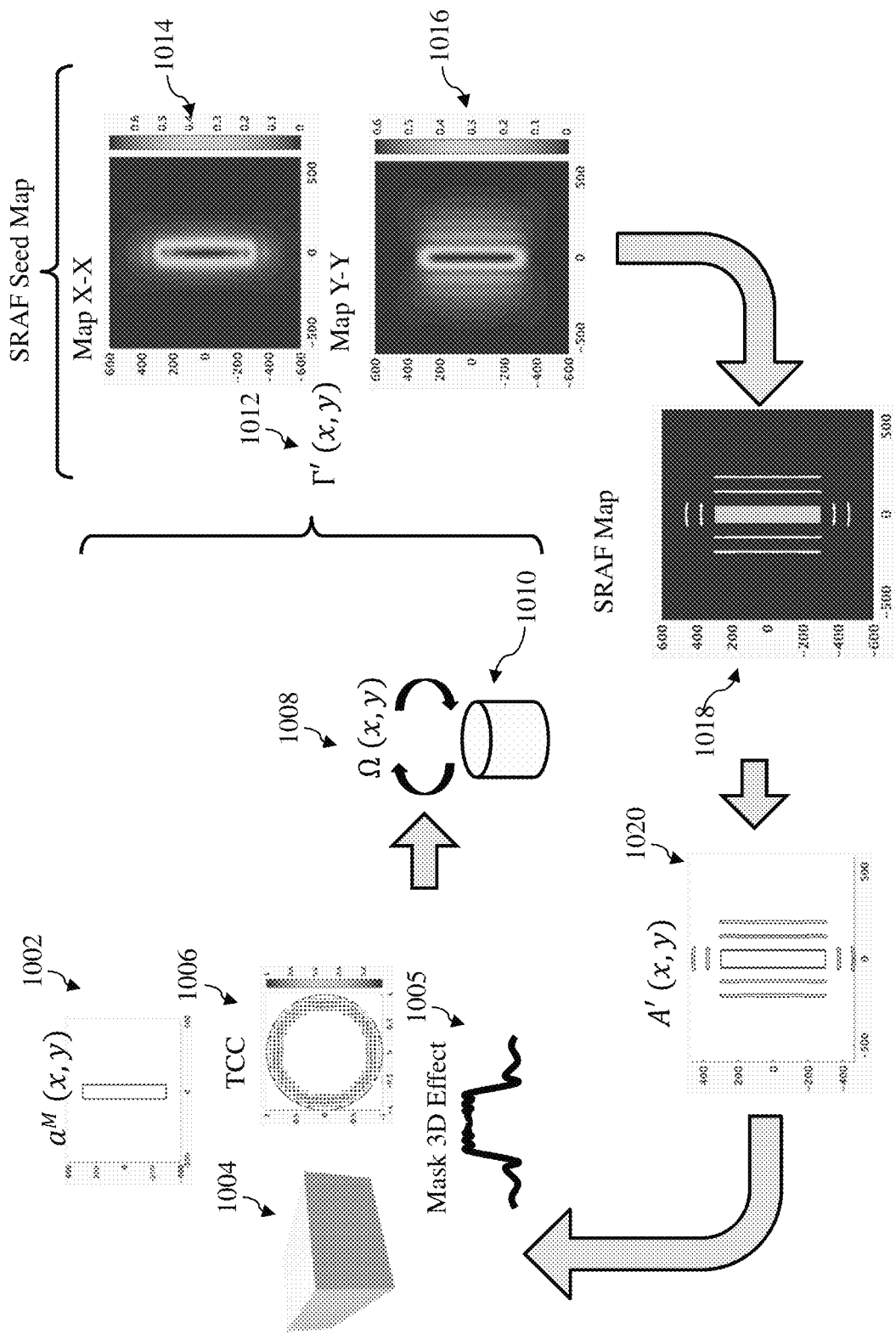
FIG. 10 is a schematic illustration of process steps of the method in FIG. 9, according to various aspects of the present disclosure.

Referring to FIGS. 9 and 10, method 900 includes a block 902 where a mask design 1002 is received. The mask design 1002 is assumed to be implemented as a real-world mask impacted by mask 3D effect and its mask function may be expressed as ($a^M(x,y)$). Operations at block 902 are substantially similar to operations at block 102. Description of some of the details is omitted for brevity. The mask function ($a^M(x,y)$) includes an X-X component ($a^{Mxx}(x,y)$), an X-Y component ($a^{Mxy}(x,y)$), a Y-X component ($a^{Myx}(x,y)$), and a Y-Y component ($a^{Myy}(x,y)$). The X-X component ($a^{Mxx}(x,y)$), the X-Y component ($a^{Mxy}(x,y)$), the Y-X component ($a^{Myx}(x,y)$), and the Y-Y component ($a^{Myy}(x,y)$) may be obtained by taking Fourier Transform of the corresponding diffraction components:

$$a^{Mxx}(x,y) = \mathrm{FT}(M_{xx}),$$

$$a^{Mxy}(x,y) = \mathrm{FT}(M_{xy}),$$

$$a^{Myx}(x,y) = \mathrm{FT}(M_{yx}),$$

$$a^{Myy}(x,y) = \mathrm{FT}(M_{yy})$$

Unlike their counterparts for an assumed ideal mask, the X-X component, X-Y component, Y-X component, and Y-Y component of the mask function $a^M(x,y)$ are not identical to one another and are to be separated considered. Because the X-X component, X-Y component, Y-X component, and Y-Y component of the mask function $a^M(x,y)$ are not identical to one another, the corresponding kernel components $\Omega^{M\,xx}(x,y)$, $\Omega^{Mxy}(x,y)$, $\Omega^{Myx}(x,y)$, and $\Omega^{Myy}(x,y)$ are not identical to one another and should be considered separately.

Referring now to FIGS. 9 and 10, method 900 includes a block 904 where an exposure tool 1004 is provided. Operations at block 904 are substantially similar to operations at block 104. Description of the details is omitted for brevity.

Referring now to FIGS. 9 and 10, method 900 includes a block 906 where a transmission cross coefficient (TCC) 1006 of the exposure tool 1004 is determined based on the set of the exposure conditions. Operations at block 904 are substantially similar to operations at block 104. Description of the details is omitted for brevity.

Referring now to FIGS. 9 and 10, method 900 includes a block 908 where a transmission cross coefficient (TCC) 1006 is decomposed into a plurality orders of eigenvalues and a plurality orders of eigenfunctions.

Referring now to FIGS. 9 and 10, method 900 includes a block 910 where a kernel 1008 is calculated based on the plurality orders of eigenvalues ($\lambda_i$) and the plurality orders of eigenfunctions ($\phi_i$), and the mask 3D diffraction components 1005. Except for the integration of the diffraction components, operations at block 910 are substantially similar to those at block 110. Descriptions of some of the details is omitted for brevity. As described above, the kernel 1008 includes X-X kernel component ($\Omega^{Mxx}(x,y)$), X-Y kernel component ($\Omega^{Mxy}(x,y)$), Y-X kernel component $\Omega^{Myx}(x,y)$, and Y-Y kernel component $\Omega^{Myy}(x,y)$ that may be separately considered and calculated.

Referring now to FIGS. 9 and 10, method 900 includes a block 912 where the kernel 1008 is stored in a memory medium 1010. Operations at block 912 are substantially similar to operations at block 112. Description of the details is omitted for brevity. In embodiments of the present disclosure, after the kernel 1008 is stored in the memory medium 1010, the kernel 1008 may be accessible, retrievable, downloadable at the computer system or other computing device communicatively coupled to the computer system, operated by an authorized user.

Referring now to FIGS. 9 and 10, method 900 includes a block 914 where an SRAF seed map 1012 is determined by convoluting the mask function ($a^M(x,y)$) and the kernel 1008. Except for the integration of the mask 3D diffraction components, operations at block 914 are substantially similar to those at block 114. Descriptions of some of the details is omitted for brevity. The SRAF seed map 1012 may be expressed as:

$$\Gamma^M(x, y) = a^{Mxx}(x, y) \otimes \Omega^{Mxx}(x, y) + a^{Mxy}(x, y) \otimes \Omega^{Mxy}(x, y) + a^{Myx}(x, y) \otimes \Omega^{Myx}(x, y) + a^{Myy}(x, y) \otimes \Omega^{Myy}(x, y)$$

It has been observed that the X-X kernel component and the Y-Y kernel component may be the predominant kernel components. In some embodiments, the X-Y kernel component and the Y-X kernel component may be omitted to further improve the turn-around-time and the SRAF seed map 1012 may be approximated as:

$$\Gamma^M(x,y) = a^{Mxx}(x,y) \otimes \Omega^{Mxx}(x,y) + a^{Myy}(x,y) \otimes \Omega^{Myy}(x,y)$$

The SRAF seed map 1012 may include an X-X map component 1014 and a Y-Y map component 1016, as shown in FIG. 10.

Referring now to FIGS. 9 and 10, method 900 includes a block 916 where further processes are performed to the SRAF seed map 1012 to obtain an SRAF map 1018. Operations at block 916 are substantially similar to those at block 116. Descriptions of some of the details is omitted for brevity.

Referring now to FIGS. 9 and 10, method 900 includes a block 918 where the mask design 1002 is modified according to the SRAF map 1018 to obtain a modified mask design 1020 (A'(x,y)). Operations at block 918 are substantially similar to those at block 118. Descriptions of some of the details is omitted for brevity.

Referring now to FIGS. 9 and 10, the method 900 includes a block 920 where photolithography is performed using the exposure tool 1004 and a modified mask manufactured based on the modified mask design 1020. Operations at block 920 are substantially similar to those at block 120. Descriptions of some of the details is omitted for brevity.

While not separately illustrated in a separate flow chart, the kernel 1008 may be stored in the memory medium 1010 and reused in conjunction with a subsequent mask design different from the mask design ($a^M(x,y)$), provided that the subsequent mask design includes a similar mask composition and a similar mask thickness. The reuse of the kernel 1008 may greatly reduce the turn-around-time without compromising accuracy of the SRAF placement.

The embodiments of the present disclosure offer advantages over existing art, though it is understood that other embodiments may offer different advantages, not all advantages are necessarily discussed herein, and that no particular advantage is required for all embodiments. By including all order of the eigenvalues and eigenfunctions of TCC in the calculation of a kernel, methods according to embodiments of the present disclosure consider exposure conditions of the exposure tool, including illumination intensity of the exposure tool, a numerical aperture of the exposure tool, a depth of focus (DOF), a thickness of a resist stack to be patterned, or a range of an aberration. In addition, methods of the present disclosure may include diffraction components to address polarization due to mask three-dimensional (3D) effect. Because of the consideration of the exposure conditions and the mask 3D effect, methods of the present disclosure have better accuracy than conventional rule-based SRAF placement techniques and IML techniques. Moreover, when methods of the present disclosure are used, a kernel generated based on a set of exposure conditions of an exposure tool may be stored and reused whenever a new mask design is introduced. The reuse of the kernel may greatly reduce the turn-around-time to a level similar to that of the rule-based techniques, which is a fraction of the turn-around-time of ILT.

Thus, one of the embodiments of the present disclosure described a method for fabricating a semiconductor device. The method includes receiving a first mask design including a first mask function, determining a transmission cross coefficient (TCC) of an exposure tool, decomposing the TCC into a plurality orders of eigenvalues and a plurality orders of eigenfunctions, calculating a kernel based on the plurality orders of eigenvalues and the plurality orders of eigenfunctions, and determining a first sub-resolution assist feature (SRAF) seed map by convoluting the first mask function and the kernel.

In some embodiments, the first SRAF seed map includes coordinates of peak positions for placement of a plurality of SRAFs. In some embodiments, the method further includes processing the first SRAF seed map to obtain a first SRAF map, modifying the first mask design according to the first SRAF map to obtain a first modified mask design, and performing photolithography using the exposure tool and the first modified mask design. In some implementations, the first SRAF map includes a plurality of SRAFs, and a polygonal shape of each of the plurality of SRAFs. In some instances, the method further includes storing the kernel in a memory medium, receiving a second mask design including a second mask function different from the first mask function, retrieving the kernel stored in the memory medium, determining a second SRAF seed map by convoluting the second mask function and the stored kernel, processing the second SRAF seed map to obtain a second SRAF map, modifying the second mask design according to the second SRAF map to obtain a second modified mask design, and performing photolithography using the exposure tool and the second modified mask design. In some implementations, the exposure tool includes an extreme ultraviolet (EUV) exposure tool or a deep ultraviolet (DUV) exposure tool. In some instances, the TCC includes information about an illumination intensity of the exposure tool, a numerical aperture of the exposure tool, a thickness of a resist stack to be patterned, or a range of an aberration.

In another of the embodiments, a method of semiconductor device fabrication is provided. The method includes receiving a first mask design including a first mask function (a (x,y)), providing an exposure tool that includes a set of exposure conditions, determining a transmission cross coefficient (TCC) of the exposure tool based on the set of exposure conditions, decomposing the TCC into a plurality orders of eigenvalues ($\lambda_i$) and a plurality orders of eigenfunctions ($\phi_i(x,y)$), calculating a kernel ($\Omega(x.y)$) based on the following mathematical formulae:

$$\Omega(x, y) = \text{Re}\left[\sum_{i=1}^{N} \lambda_i \phi_i^*(0,0) \phi_i(-x, -y)\right]$$

and determining a first sub-resolution assist feature (SRAF) seed map (Γ(x,y)) by convoluting the kernel and the first mask function using the following mathematical formula:

$$\Gamma(x,y)=a(x,y)\otimes\Omega(x,y).$$

In some embodiments, the method further includes determining a first sub-resolution assist feature (SRAF) seed map (Γ(x,y)) by convoluting the kernel and the first mask function using the following mathematical formula:

$$\Gamma(x,y)=a(x,y)\otimes\Omega(x,y).$$

The first mask design is assumed to be implemented as an ideal mask. In some embodiments, the first mask function includes an X-X component ($a^{xx}(x,y)$), an X-Y component ($a^{xy}(x,y)$), a Y-X component ($a^{yx}(x,y)$), and a Y-Y component ($a^{yy}(x,y)$). The plurality orders of eigenvalues include a first plurality orders of X-X interaction eigenfunctions ($\phi_i^{xx}(x,y)$), a second plurality orders of X-Y interaction eigenfunctions ($\phi_i^{xy}(x,y)$), a third plurality orders of Y-X interaction eigenfunctions ($\phi_i^{yx}(x,y)$), and a fourth plurality orders of Y-Y interaction eigenfunctions ($\phi_i^{yy}(x,y)$). The kernel includes an X-Y kernel component ($\Omega^{xy}(x,y)$), a Y-X kernel component ($\Omega^{yx}(x,y)$), and a Y-Y kernel component ($\Omega^{yy}(x,y)$) respectively expressed by the following mathematical formulae:

$$\Omega^{XX}(x, y) = \mathrm{Re}\left[\sum_{i=1}^{N}\lambda_i\phi_i^{XX*}(0,0)\phi_i^{XX}(-x, -y)\right],$$

$$\Omega^{XY}(x, y) = \mathrm{Re}\left[\sum_{i=1}^{N}\lambda_i\phi_i^{XY*}(0,0)\phi_i^{XY}(-x, -y)\right],$$

$$\Omega^{YX}(x, y) = \mathrm{Re}\left[\sum_{i=1}^{N}\lambda_i\phi_i^{YX*}(0,0)\phi_i^{YX}(-x, -y)\right],$$

$$\text{and } \Omega^{YY}(x, y) = \mathrm{Re}\left[\sum_{i=1}^{N}\lambda_i\phi_i^{YY*}(0,0)\phi_i^{YY}(-x, -y)\right].$$

In some embodiments, the method further includes determining a first sub-resolution assist feature (SRAF) seed map (Γ(x,y)) by convoluting the kernel and the first mask function using the following mathematical formula:

$$\Gamma(x,y)=a^{xx}(x,y)\otimes\Omega^{xx}(x,y)+a^{xy}(x,y)\otimes\Omega^{xy}(x,y)+a^{yx}(x,y)\otimes\Omega^{yx}(x,y)+a^{yy}(x,y)\otimes\Omega^{yy}(x,y),$$

wherein the first mask design is assumed to be implemented as a real-world mask. In some embodiments, the set of exposure conditions includes an illumination intensity of the exposure tool, a numerical aperture of the exposure tool, a thickness of a resist stack to be patterned, or a range of an aberration. In some implementations, the method further includes storing the kernel in a memory medium. In some embodiments, the method further includes processing the first SRAF seed map to obtain a first SRAF map, modifying the first mask design according to the first SRAF map to obtain a first modified mask design, and performing photolithography using the exposure tool and the first modified mask design. In some instances, the processing of the first SRAF seed map includes filtering the first SRAF seed map to remove noise, resulting in a filtered first SRAF seed map and fitting polygonal shapes onto the filtered first SRAF seed map.

In yet other embodiments, a method of semiconductor device fabrication is provided. The method includes receiving a first mask design including a first mask function (a(x,y)), the first mask function (a(x,y)) including an X-X component ($a^{xx}(x,y)$) and a Y-Y component ($a^{yy}(x,y)$), providing an exposure tool that includes a set of exposure conditions, determining a transmission cross coefficient (TCC) of the exposure tool based on the set of exposure conditions, decomposing the TCC into a plurality orders of eigenvalues ($\lambda_i$), a first plurality orders of X-X interaction eigenfunctions ($\phi_i^{xx}(x,y)$), a second plurality orders of Y-Y interaction eigenfunctions ($\phi_i^{yy}(x,y)$), calculating an X-X kernel component ($\Omega^{xx}(x,y)$) and a Y-Y kernel component ($\Omega^{yy}(x,y)$) based on the following mathematical formulae:

$$\Omega^{XX}(x, y) = \mathrm{Re}\left[\sum_{i=1}^{N}\lambda_i\phi_i^{XX*}(0,0)\phi_i^{XX}(-x, -y)\right],$$

$$\text{and } \Omega^{YY}(x, y) = \mathrm{Re}\left[\sum_{i=1}^{N}\lambda_i\phi_i^{YY*}(0,0)\phi_i^{YY}(-x, -y)\right],$$

and
determining a first sub-resolution assist feature (SRAF) seed map (Γ(x,y)) by convoluting the kernel and the first mask function using the following mathematical formula:

$$\Gamma(x,y)=a^{xx}(x,y)\otimes\Omega^{xx}(x,y)+a^{yy}(x,y)\otimes\Omega^{yy}(x,y).$$

In some embodiments, the exposure tool includes a pupil. The X-X kernel component includes a simulated interaction between an X-polarized radiation on the first mask design and an X-polarized radiation on the pupil and the Y-Y kernel component includes a simulated interaction between a Y-polarized radiation on the first mask design and a Y-polarized radiation on the pupil. In some implementations, the method further includes processing the first SRAF seed map to obtain a first SRAF map, modifying the first mask design according to the first SRAF map to obtain a first modified mask design, and performing photolithography using the exposure tool and the first modified mask design. In some instances, the processing of the first SRAF seed map includes filtering the first SRAF seed map to remove noise, resulting in a filtered first SRAF seed map, and fitting polygonal shapes onto the filtered first SRAF seed map. In some embodiments, the exposure tool includes an extreme ultraviolet (EUV) exposure tool or a deep ultraviolet (DUV) exposure tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   determining a transmission cross coefficient (TCC) of an exposure tool;
   decomposing the TCC into a plurality orders of eigenvalues and a plurality orders of eigenfunctions;
   calculating a kernel based on the plurality orders of eigenvalues and the plurality orders of eigenfunctions;
   storing the kernel in a memory medium;

receiving a mask design comprising a mask function
determining a sub-resolution assist feature (SRAF) seed map by convoluting the mask function and the stored kernel;
processing the SRAF seed map to obtain an SRAF map;
modifying the mask design according to the SRAF map to obtain a modified mask design; and
performing photolithography using the exposure tool and the modified mask design.

2. The method of claim 1, wherein the mask function is determined based on an assumption that the mask design has an infinitely small thickness.

3. The method of claim 1,
wherein the mask function is determined based on an assumption that the mask design has a finite thickness,
wherein a mask three-dimensional (3D) effect of the mask design comprises an X-X diffraction component ($M_{xx}$), an X-Y diffraction component ($M_{xy}$), a Y-X diffraction component ($M_{yx}$), and a Y-Y diffraction component ($M_{yy}$).

4. The method of claim 3, wherein the mask function comprises an X-X component ($a^{Mxx}(x, y)$), an X-Y component ($a^{Mxy}(x, y)$), a Y-X component ($a^{Myx}(x, y)$), and a Y-Y component ($a^{Myy}(x, y)$).

5. The method of claim 4,
wherein the X-X component ($a^{Mxx}(x, y)$) of the mask function is obtained by taking a Fourier Transform of the X-X diffraction component ($M_{xx}$),
wherein the X-Y component ($a^{Mxy}(x, y)$) of the mask function is obtained by taking a Fourier Transform of the X-Y diffraction component ($M_{xy}$),
wherein the Y-X component ($a^{Myx}(x, y)$) of the mask function is obtained by taking a Fourier Transform of the Y-X diffraction component ($M_{yx}$),
wherein the Y-Y component ($a^{Myy}(x, y)$) of the mask function is obtained by taking a Fourier Transform of the Y-Y diffraction component ($M_{yy}$).

6. The method of claim 1, wherein the exposure tool comprises an extreme ultraviolet (EUV) exposure tool or a deep ultraviolet (DUV) exposure tool.

7. The method of claim 1, wherein the TCC comprises information about an illumination intensity of the exposure tool, a numerical aperture of the exposure tool, a thickness of a resist stack to be patterned, or a range of an aberration.

8. The method of claim 1, wherein the SRAF map comprises:
a plurality of SRAFs; and
a polygonal shape of each of the plurality of SRAFs.

9. A method, comprising:
determining a transmission cross coefficient (TCC) of an exposure tool;
decomposing the TCC into a plurality orders of eigenvalues and a plurality orders of eigenfunctions;
calculating a kernel based on the plurality orders of eigenvalues and the plurality orders of eigenfunctions;
storing the kernel in a memory medium;
receiving a mask design comprising a mask function
determining a sub-resolution assist feature (SRAF) seed map by convoluting the mask function and the stored kernel;
processing the SRAF seed map to obtain an SRAF map;
modifying the mask design according to the SRAF map to obtain a modified mask design; and
performing photolithography using the exposure tool and the modified mask design,
wherein the TCC comprises information about an illumination intensity of the exposure tool, a numerical aperture of the exposure tool, a thickness of a resist stack to be patterned, or a range of an aberration.

10. The method of claim 9, wherein the mask function is determined based on an assumption that the mask design has an infinitely small thickness.

11. The method of claim 9,
wherein the mask function is determined based on an assumption that the mask design has a finite thickness,
wherein a mask three-dimensional (3D) effect of the mask design comprises an X-X diffraction component ($M_{xx}$), an X-Y diffraction component ($M_{xy}$), a Y-X diffraction component ($M_{yx}$), and a Y-Y diffraction component ($M_{yy}$).

12. The method of claim 11, wherein the mask function comprises an X-X component ($a^{Mxx}(x, y)$), an X-Y component ($a^{Mxy}(x, y)$), a Y-X component ($a^{Myx}(x, y)$), and a Y-Y component ($a^{Myy}(x, y)$).

13. The method of claim 12,
wherein the X-X component ($a^{Mxx}(x, y)$) of the mask function is obtained by taking a Fourier Transform of the X-X diffraction component ($M_{xx}$),
wherein the X-Y component ($a^{Mxy}(x, y)$) of the mask function is obtained by taking a Fourier Transform of the X-Y diffraction component ($M_{xy}$),
wherein the Y-X component ($a^{Myx}(x, y)$) of the mask function is obtained by taking a Fourier Transform of the Y-X diffraction component ($M_{yx}$),
wherein the Y-Y component ($a^{Myy}(x, y)$) of the mask function is obtained by taking a Fourier Transform of the Y-Y diffraction component ($M_{yy}$).

14. The method of claim 9, wherein the exposure tool comprises an extreme ultraviolet (EUV) exposure tool or a deep ultraviolet (DUV) exposure tool.

15. The method of claim 9, wherein the SRAF map comprises:
a plurality of SRAFs; and
a polygonal shape of each of the plurality of SRAFs.

16. The method of claim 9, further comprising retrieving the stored kernel for reuse.

17. The method of claim 16, wherein the processing of the SRAF seed map comprises:
filtering the SRAF seed map to remove noise to obtain a filtered SRAF seed map; and
fitting polygonal shapes onto the filtered SRAF seed map.

18. A method, comprising:
receiving a mask design comprising a mask function;
determining a sub-resolution assist feature (SRAF) seed map by convoluting the mask function and a kernel stored in a memory medium, wherein the kernel is unique to a set of exposure conditions unique to an exposure tool and the SRAF seed map includes a local-minimum interference distribution, a local maximum interference distribution, and noise;
processing the SRAF seed map to obtain an SRAF map;
modifying the mask design according to the SRAF map to obtain a modified mask design; and
performing photolithography using the exposure tool and the modified mask design.

19. The method of claim 18, wherein the processing of the SRAF seed map comprises:
filtering the SRAF seed map to remove the noise to obtain a filtered SRAF seed map; and
fitting polygonal shapes onto the filtered SRAF seed map.

20. The method of claim 18, further comprising:
determining a transmission cross coefficient (TCC) of the exposure tool based on the set of exposure conditions;

decomposing the TCC into a plurality orders of eigenvalues and a plurality orders of eigenfunctions;
calculating the kernel based on the plurality orders of eigenvalues and the plurality orders of eigenfunctions; and
storing the kernel in the memory medium.

\* \* \* \* \*